United States Patent
Lee et al.

(10) Patent No.: US 9,019,248 B2
(45) Date of Patent: Apr. 28, 2015

(54) ELECTRONIC PAPER DISPLAY DEVICE AND METHOD FOR MANUFACTURING THE SAME

(75) Inventors: Jaechan Lee, Gyeonggi-do (KR); Haksun Kim, Daejeon (KR); Hyunhak Kim, Gyeonggi-do (KR); Changsoo Lim, Seoul (KR); Unghan Moon, Gyeonggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 595 days.

(21) Appl. No.: 13/293,956

(22) Filed: Nov. 10, 2011

(65) Prior Publication Data

US 2012/0139884 A1    Jun. 7, 2012

(30) Foreign Application Priority Data

Dec. 1, 2010    (KR) .................. 10-2010-0121470

(51) Int. Cl.
*G06F 3/038* (2013.01)
*G02F 1/167* (2006.01)
*G02F 1/1345* (2006.01)

(52) U.S. Cl.
CPC ............ *G02F 1/167* (2013.01); *G02F 1/13452* (2013.01)

(58) Field of Classification Search
CPC ........... G06F 3/147; G09G 2310/0221; G09G 2330/02; G09G 2380/02
USPC ......................................... 345/84, 5, 92, 204
See application file for complete search history.

(56) References Cited

U.S. PATENT DOCUMENTS

| 2002/0015005 | A1* | 2/2002 | Imaeda ............................ 345/5 |
| 2005/0224947 | A1* | 10/2005 | Hsu et al. ...................... 257/686 |
| 2006/0001626 | A1* | 1/2006 | Saito et al. ...................... 345/84 |
| 2007/0076577 | A1* | 4/2007 | Furuichi .................... 369/275.4 |
| 2007/0241200 | A1 | 10/2007 | Sawachi |
| 2010/0182287 | A1 | 7/2010 | Lee et al. |

(Continued)

FOREIGN PATENT DOCUMENTS

| EP | 1 387 403 A2 | 2/2004 |
| GB | 2476840 A | 7/2011 |
| JP | 2002-229013 A | 8/2002 |

(Continued)

OTHER PUBLICATIONS

Korean Office Action issued in Korean Patent Application No. KR 10-2010-0121470 dated Apr. 12, 2012.

(Continued)

*Primary Examiner* — Quan-Zhen Wang
*Assistant Examiner* — Tony Davis
(74) *Attorney, Agent, or Firm* — McDermott Will & Emery LLP

(57) ABSTRACT

Disclosed herein are an electronic paper display device and a method for manufacturing the same. The electronic paper display device including an electronic paper panel and various components, includes: a substrate made of an insulating material and being provided with wirings on a surface thereof and therein; and a driving IC bonded to the substrate and controlling the electronic paper panel to display an image, whereby it be manufactured by a more simplified process as compared to that of the related art and can remarkably reduce product costs by using more inexpensive components that are necessary as compared to those of the related art.

6 Claims, 4 Drawing Sheets

(56) References Cited

U.S. PATENT DOCUMENTS

2010/0244281 A1* 9/2010 Hayashi et al. ............... 257/784
2010/0321908 A1* 12/2010 Shiota ........................... 361/771

FOREIGN PATENT DOCUMENTS

| JP | 2004-177713 A | 6/2004 |
| JP | 2005-064265 A | 3/2005 |
| JP | 2007-232838 A | 9/2007 |
| JP | 2008-165219 A | 7/2008 |
| KR | 10-2007-0010288 A | 1/2007 |
| WO | WO-2005/103808 A1 | 11/2005 |
| WO | WO-2010/010743 A1 | 1/2010 |

OTHER PUBLICATIONS

United Kingdom Combined Search and Examination Report issued in Application No. GB1119102.0 dated Mar. 6, 2012.
P. Langer., "Tape Automated Bonding," Advantest (Europe) GmbH. Oct. 1, 2004; See <http://www.advantest.de/dasat/index.php?cid=100336&conid=100755>.
United Kingdom Office Action issued in Application No. GB 1119102.0 dated Feb. 21, 2013.

* cited by examiner

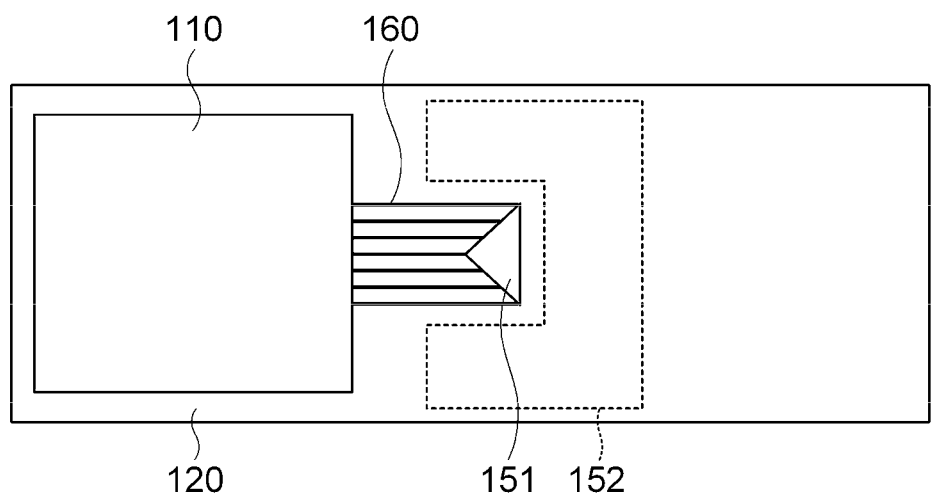

ELECTRONIC PAPER DISPLAY DEVICE AND METHOD FOR MANUFACTURING THE SAME

CROSS REFERENCE(S) TO RELATED APPLICATIONS

This application claims the benefit under 35 U.S.C. Section 119 of Korean Patent Application Serial No. 10-2010-0121470, entitled "Electronic Paper Display Device And Method For Manufacturing The Same" filed on Dec. 1, 2010, which is hereby incorporated by reference in its entirety into this application.

BACKGROUND OF THE INVENTION

1. Technical Field

The present invention relates to an electronic paper display device and a method for manufacturing the same, and more particularly, to an electronic paper display device capable of using a material having lower costs compared to the related art and reducing manufacturing costs due to a simple process thereof, and a method for manufacturing the same.

2. Description of the Related Art

Among next generation display devices, an electronic paper display device has larger availability and flexibility than those of other display devices and is able to be driven with low power. Therefore, the electronic paper display device can replace paper printed media such as books and be applied to various kinds of fields, such as screens, electronic wall paper, and the like.

Recently, research into the introduction of an electronic paper display (EPD) over broad fields such as electronic books, electronic shelf label tag (ESLT), signature input device of a credit card terminal, and the like have been conducted and a lot of prototypes have already been released.

In particular, with the increase in big discount stores or retailers, there has been a rapidly increasing demand for an electronic shelf label tag into which the electronic paper display device is introduced.

Meanwhile, in a general driving IC for driving an electronic paper display device according to the related art, a pad pitch is 67 µm or less and a minimum line width is about 25 µm. As a result, when a substrate is manufactured by a manufacturing process of a printed circuit board according to the related art, the manufacturing costs of the printed circuit board may increase due to the reduction in line width.

Therefore, the electronic paper display device according to the related art is manufactured by bonding an electronic paper panel boned to a substrate, a main board bonded with various circuit components, and a driving IC. If an anisotropic conductive film (AFC) mainly used during the bonding process is used, processes of cutting, flip-chip bonding, and the like are accompanied. As a result, at least three materials and three steps are needed and it takes a long time to be subjected to the processes, thereby inevitably increasing product costs.

Therefore, in a field in which it is relatively sensitive to product costs such as an electronic shelf label tag, it is difficult to introduce an electronic paper display device thereto. Therefore, an urgent need exists for an inexpensive electronic shelf label tag having an electronic paper display panel and a method for manufacturing the same.

SUMMARY OF THE INVENTION

An object of the present invention is to provide an electronic paper display device capable of simplifying a manufacturing process and being implemented using inexpensive components as compared to the related art.

Another object of the present invention is to provide a method for manufacturing an electronic paper display device capable of implementing the electronic paper display using inexpensive components and reducing product costs by simplifying a manufacturing process as compared to the related art.

In addition, another object of the present invention is to provide an electronic paper display device capable of being miniaturized by providing a new driving IC packaging structure in which wirings can be efficiently disposed on a substrate or a board and reducing a size of the substrate or the board included in the electronic paper display device.

According to an exemplary embodiment of the present invention, there is provided an electronic paper display device including an electronic paper panel and various components, including: a substrate made of an insulating material and being provided with wirings on a surface thereof and therein; and a driving IC bonded to the substrate and controlling the electronic paper panel to display an image.

The driving IC may be bonded to a top surface of a packaging unit whose both surfaces are provided with wirings to bond a bottom surface of the packaging unit to the substrate.

The both surfaces of the substrate may be provided with the driving IC by additionally bonding the driving IC bonded to the bottom surface of the packaging unit whose both surfaces are provided with the wirings to the bottom surface of the substrate.

The substrate may be provided with an inserting hole corresponding to the driving IC, the driving IC may be bonded to the bottom surface of the packaging unit provided with the wirings formed on the bottom surface, the driving IC may be inserted into the inserting hole, and the bottom surface of the packaging unit may be bonded to the substrate.

The both surfaces of the substrate may be provided with the driving IC by additionally bonding the driving IC bonded to the top surface of the packaging unit whose both surfaces are provided with the wirings to the bottom surface of the substrate. At this time, the bottom surface of the substrate may be provided with the inserting hole corresponding to the driving IC and the inserting hole may be provided so as to penetrate through the top and the bottom of the substrate.

The packaging unit may have a triangular shape or a semicircular shape so as to improve efficiency of the wirings.

According to another exemplary embodiment of the present invention, there is provided a method for manufacturing an electronic paper display device, including: manufacturing a substrate; and bonding an electronic paper panel, components, and a driving IC to the substrate.

At this time, the manufacturing the substrate may include forming an inserting hole into which the driving IC is inserted in a position to which the driving IC is to be bonded.

The bonding the electronic paper panel, the components, and the driving IC to the substrate may include: bonding the driving IC to the bottom surface of the packaging unit whose bottom surface is provided with the wirings; and inserting the driving IC into the inserting hole of the substrate and bonding the bottom surface of the packaging unit to the substrate so that the wirings of the bottom surface of the packaging unit are connected to the wirings of the substrate.

Meanwhile, the driving IC in a state in which it is attached to the packaging unit may be previously prepared.

BRIEF DESCRIPTION OF THE DRAWINGS

FIG. 8B is a plan view showing a gain due to efficient wirings.

DESCRIPTION OF THE PREFERRED EMBODIMENTS

Figure 1:
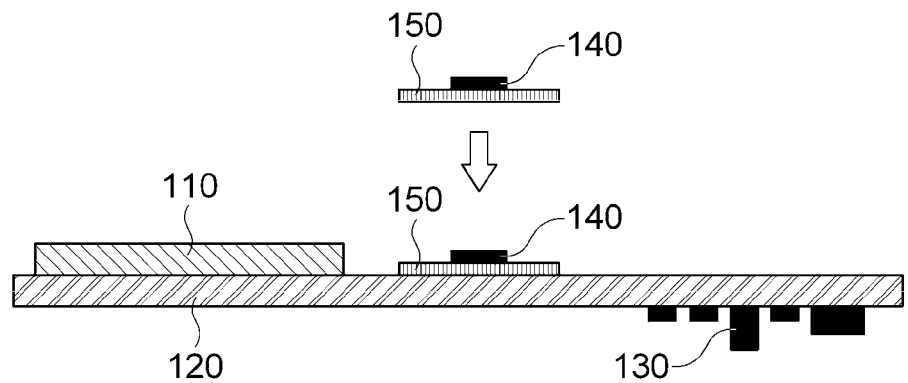
FIG. 1 is a cross-sectional view showing a configuration according to an exemplary embodiment of the present invention.

Various advantages and features of the present invention and methods accomplishing thereof will become apparent from the following description of embodiments with reference to the accompanying drawings. However, the present invention may be modified in many different forms and it should not be limited to the embodiments set forth herein. These embodiments may be provided so that this disclosure will be thorough and complete, and will fully convey the scope of the invention to those skilled in the art. Like reference numerals in the drawings denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or components 130 but not the exclusion of any other constituents, steps, operations and/or components 130.

The acting effects and technical configuration with respect to the objects of an electronic paper display device and a method for manufacturing the same according to the present invention will be clearly understood by the following description in which exemplary embodiments of the present invention are described with reference to the accompanying drawings.

Hereinafter, an electronic paper display device according to an exemplary embodiment of the present invention will be described with reference to FIGS. 1 and 2.

An electronic paper display device according to an exemplary embodiment of the present invention is configured to include a driving IC 140, components 130, and an electronic paper panel 110 provided on a single substrate 120.

Referring to FIG. 1, the electrode paper display device according to the present invention may be configured such that the electronic paper panel 110 is bonded onto the single substrate 120, the components 130 are bonded thereto, and the driving IC 140 is bonded to the substrate 120 by bonding a film 150 to a bottom surface of the driving IC 140.

Meanwhile, according to the present embodiment, the bottom surface of the film 150 is bonded to the substrate 120, while the driving IC 140 is bonded to the top surface of the film 150. Therefore, the film 150 should be able to electrically connect the driving IC 140 to wirings 160 on the substrate 120.

To this end, the wirings 160 may be provided on the top surface and the bottom surface of the film 150. Alternatively, the wirings 160 may be provided only on the bottom surface of the film 150 and an external terminal of the driving IC 140 may be connected to the wirings 160 provided on the bottom surface of the film 150 by penetrating through the film 150.

Meanwhile, in order to increase the number of segments, an additional number of driving ICs 140 may be needed. In this case, although not shown, a second driving IC unit formed by bonding the driving IC 140 to a bottom surface of a packaging unit 150 of which both surfaces are provided with wirings is additionally bonded to a bottom surface of the substrate 120, such that the driving IC 140 may be provided on both surfaces of the substrate 120. When the driving IC 140 is provided on both surfaces of the substrate, it is possible to accomplish effects of doubling function, while not increasing the entire area of the substrate 120.

Figure 3:
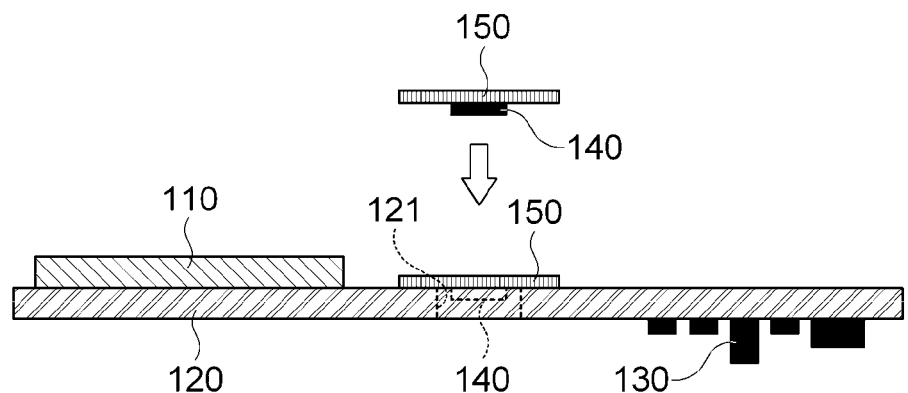
FIG. 3 is a cross-sectional view showing a configuration according to another exemplary embodiment of the present invention.
Figure 5:
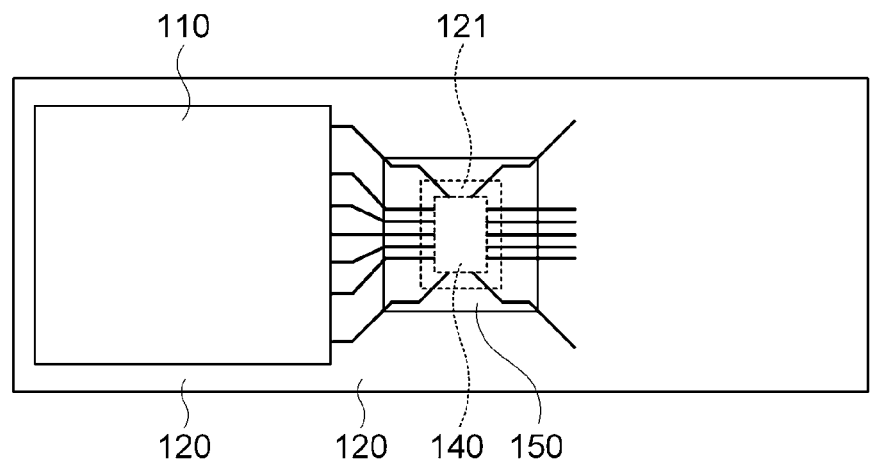
FIG. 5 is a plan view of FIG. 3.

FIGS. 3 and 5 illustrate a configuration according to another exemplary embodiment of the present invention.

Figure 2:
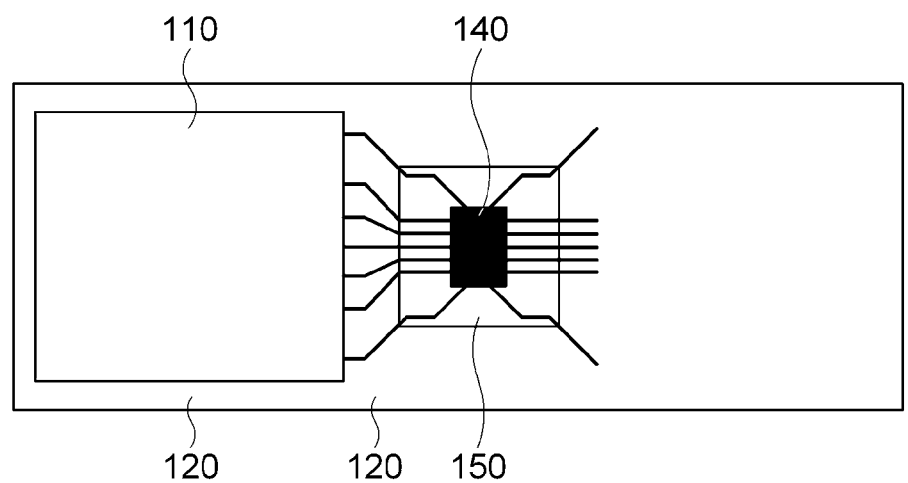
FIG. 2 is a plan view of FIG. 1.

Most of the constituents are entirely similar to those shown in FIGS. 1 and 2, such that a detailed description thereof will be omitted.

According to the present embodiment, an inserting hole 121 is provided in a substrate 120 so that a driving IC 140 may be configured to be inserted into the inserting hole 121 of the substrate 120.

In addition, a film may be used as a packaging unit 150 in order to connect wirings 160 simultaneously while firmly fixing and protecting the driving IC 140 to the substrate 120.

The film 150 should be connected to the wirings 160 of the substrate 120 simultaneously while being connected to an external terminal of the driving IC 140. In this case, the driving IC 140 is inserted into the inserting hole 121 of the substrate 120, such that the wirings 160 may be provided only on the surface bonded to the driving IC 140 and the substrate 120.

When the present embodiment as described above is used, therefore, the process of implementing the wirings 160 on the film 150 can be implemented at inexpensive costs as compared to the embodiment shown in FIG. 1. At this time, the driving IC 140 is inserted into the substrate 120, such that a separate structure or packaging for protecting the driving IC 140 is not required, which leads to more preferable results.

Figure 4:
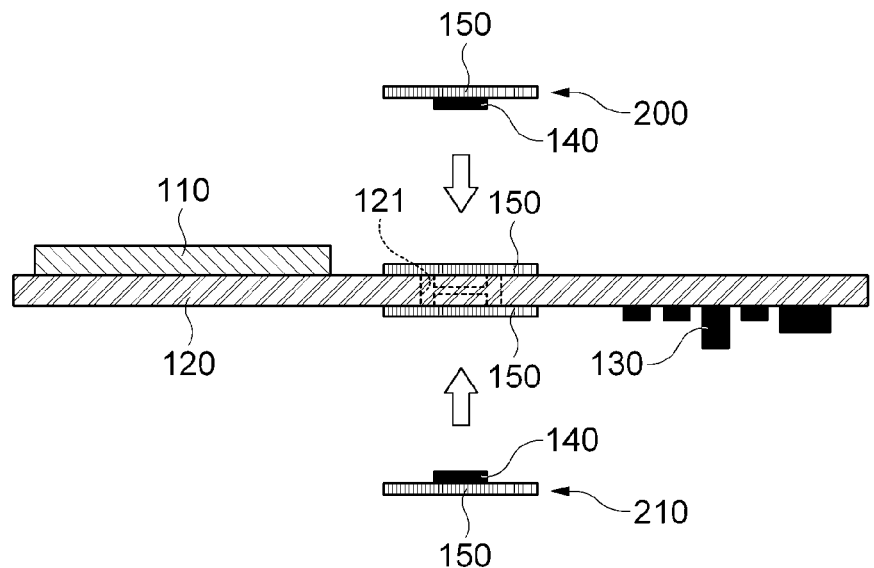
FIG. 4 is a cross-sectional view showing a configuration according to still another exemplary embodiment of the present invention.

In addition, in order to increase the number of segments, an additional number of driving ICs 140 may be needed. In this case, as shown in FIG. 4, a second driving IC unit 210 formed by bonding the driving IC 140 to a top surface of the packaging unit 150 of which a top surface is provided with wirings is additionally bonded to a bottom surface of the substrate 120, such that the driving IC 140 may be provided on both surfaces of the substrate 120. At this time, an inserting hole 121 corresponding to the driving IC 140 may be provided in the bottom surface of the substrate 120, wherein the inserting hole 121 may be provided so as to penetrate through a top portion and a bottom portion of the substrate 120. When the driving IC 140 is provided on both surfaces of the substrate, it is possible to accomplish the effects of doubling functions, while not increasing the entire area of the substrate 120.

Meanwhile, as shown in FIGS. 3 and 5, when the driving IC 140 is inserted into the inserting hole 121 of the substrate 120, the driving IC 140 may be bonded to the substrate 120 using various kinds of adhesives. In this case, when connecting the external terminal of the driving IC 140 with the wirings 160 of the substrate 120, various connecting methods such as a solder ball connecting method may be used. However, as described above, when the pad pitch and the minimum line width of the substrate 120 are implemented so as to correspond to the pad pitch and the minimum line width of the driving IC 140, it leads to increase in product costs.

Figure 6:
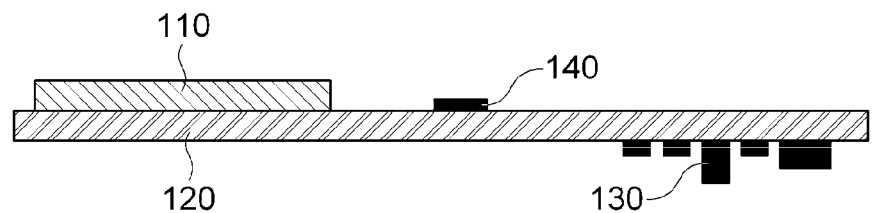
FIG. 6 is a cross-sectional view showing a configuration according to yet still another exemplary embodiment of the present invention.
Figure 7:
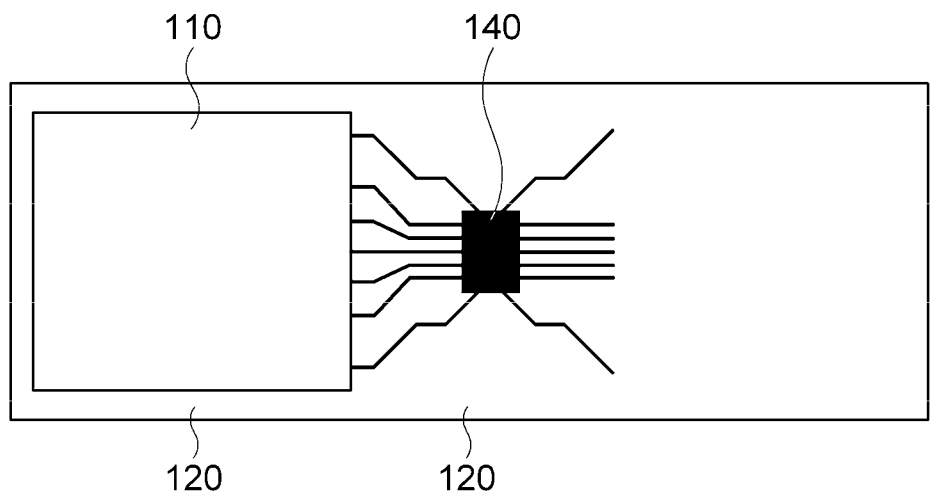
FIG. 7 is a plan view of FIG. 6.

FIGS. 6 and 7 show a method of bonding the driving IC 140 directly to the substrate 120 without the inserting hole 121. However, this method also inevitably leads to increase in product costs due to the pad pitch between the driving IC 140 and the substrate 120 and the minimum line width matching thereof.

Figure 8A:
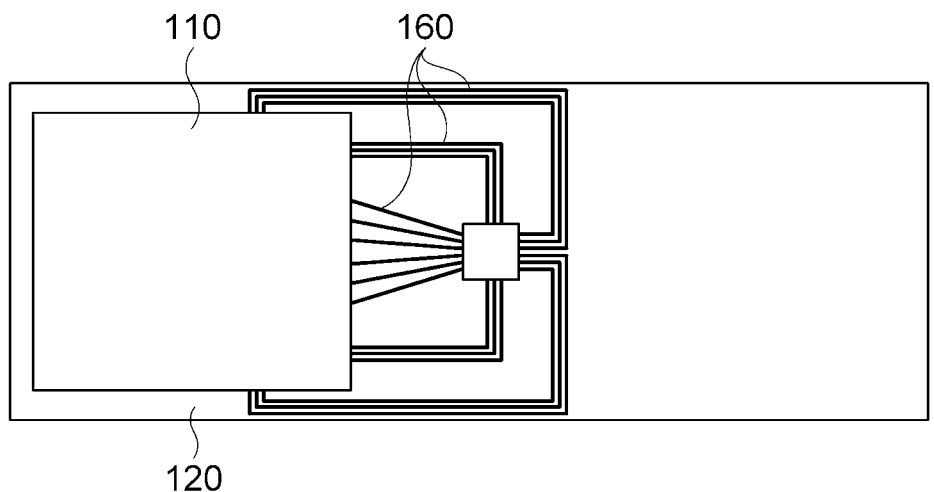
FIG. 8A is a plan view showing a gain due to efficient wirings.

FIG. 8B shows an example in which the film 150, which is the packaging unit 150, is implemented to have a triangular shape. If the film 150 is implemented to have a triangular shape, the wirings 160 may be efficiently disposed as compared to a case in which the film 150 is bonded, while generally having a rectangular shape or a quadrangular shape, as shown in FIG. 8A. Thereby, it is possible to secure a spare space 152 on the substrate 120, the spare space 152 without the wirings 160. The entire size of the substrate 120 is reduced using the spare space 152, thereby making it possible to miniaturize the device.

In the general electronic paper display device according to the related art, the film 151 should protect the driving IC and be electrically connected to the outside, while simultaneously being firmly bonded thereto and having flexibility. Therefore, it has been difficult to implement the film 150 to have a triangular shape as shown in FIG. 8B. However, in the present invention, the film 150 only serves to bond the driving IC 140 onto the substrate 120 and be electrically connected, such that the film 150, which is the packaging unit 150, may be implemented to have a triangular shape or a semicircular shape (not show). Thereby, even in a case in which a number of pins are provided such as a display driving IC in a passive segment scheme, the pins protruded to the outside from the package IC may be efficiently connected to the substrate.

Meanwhile, the shape of the packaging unit is not limited to the triangular shape or the semicircular shape but may be implemented through various modifications.

Hereinafter, a method for manufacturing an electronic paper display device according to another exemplary embodiment of the present invention will be described.

The method for manufacturing an electronic paper display device includes: manufacturing a substrate; and bonding an electronic paper panel, components and a driving IC to the substrate.

The manufacturing the substrate may be performed by a method of manufacturing a general printed circuit board.

At this time, the electronic paper panel, the components, and the driving IC may be bonded in random order.

In addition, unlike the general package IC, the driving IC may also be compression-machined during the laminating process of the electronic paper, instead of a surface mount technology (SMT) or a COF bonding method.

Meanwhile, the manufacturing the substrate may include forming an inserting hole into which the driving IC is inserted in a position to which the driving IC is to be bonded.

The inserting hole may be formed while applying an insulating material and be formed by cutting a predetermined portion thereof in a state in which the substrate is formed.

In addition, the bonding the driving IC to the substrate may be performed by inserting the driving IC to the substrate provided with the inserting hole and then applying an adhesive thereto or bonding a film provided with wirings to an exposed surface.

In addition, the driving IC may be prepared by being first bonded to the film, which is the packaging unit, before being bonded to the substrate. In this case, the wirings of the film may be bonded to be matched with the wirings of the substrate, simultaneously while the packaged driving IC being inserted into the inserting hole.

In manufacturing a printed circuit board (PCB) according to the specification corresponding to the pad pitch and the minimum line width of an integrated circuit for driving an electronic paper, it costs a great deal. Therefore, both sides of a driving IC packaged in a chip on film (COF) scheme are bonded using an anisotropic conductive film (ACF) to connect wirings, thereby manufacturing an electronic paper display device.

When the electronic paper display device is manufactured using the method according to the related art, the costs of the electronic paper display device itself cannot but increase due to the high material costs and the complicated process. As a result, there is a difficulty in applying the electronic paper display device to the fields requiring an inexpensive product, such as an electronic shelf label tag or the like.

However, according to the configurations of the exemplary embodiments of the present invention, the electronic paper panel 110, the driving IC 140, and various components 130 are bonded to the single substrate 120 to implement the electronic paper display device, thereby making it possible to remarkably reduce product costs.

Meanwhile, the driving IC according to the related art is packaged using a COF film, wherein the COF film is provided with wirings to electrically connect the driving IC with the external wirings. In addition, in the electronic paper display device according to the related art, the COF film should have high durability, while electrically connecting other components or the electronic paper panel. Therefore, the COF film should be made of a flexible and strong material, which leads to significant increase in costs as compared to general films. In addition, the COF driving IC according to the related art is bonded by an ACF bonding method, such that necessary processes of cutting, flip chip bonding and the like are performed, which leads to low production and expensive processing costs.

The core object of the present invention is to reduce product costs. Therefore, the present invention is proposed during a process of developing a method capable of replacing the COF with other low-priced film 150.

When the electronic paper panel 110, the components 130, and the driving IC 140 are bonded to the single substrate 120, the film 150, which is the packaging unit 150 of the driving IC 140, needs not to have high durability as compared to the COF film 150. Therefore, the film 150 may use a low-priced film material such as polyethelenenaphthalate (PEN), polyimide (PI), polyethelene terephthalate (PET) or the like.

In addition, since the driving IC 140 is bonded directly to the substrate 120, a molding process of packaging the driving IC 140, or the like needs not to be performed, which reduces a process, a packaging molding liquid needs not to be used, which reduces material costs, and a lead frame needs not to be configured, which further reduces processing costs.

The electronic paper display device configured as described above can be manufactured by a more simplified process as compared to that of the related art and can remarkably reduce product costs by using more inexpensive components that are necessary as compared to those of the related art.

In addition, the method for manufacturing an electronic paper display device according to the present invention can implement the electronic paper display device by using more inexpensive components and a more simplified process as compared to those of the related art.

In addition, the present invention provides the package structure of the new driving IC capable of efficiently disposing the wirings on the substrate to reduce the size of the substrate included in the electronic paper display device, thereby making it possible to miniaturize the electronic paper display device.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. An electronic paper display device including an electronic paper panel and various components, comprising:
   a substrate made of an insulating material and being provided with wirings on a surface thereof and therein; and
   a driving IC bonded to the substrate and controlling the electronic paper panel to display an image,
   wherein the substrate is provided with an inserting hole corresponding to the driving IC,
   the inserting hole penetrates through a top portion and a bottom portion of the substrate,
   the driving IC is bonded to a bottom surface of a packaging unit provided with wirings formed on the bottom surface,
   the driving IC is inserted into the inserting hole, and
   the bottom surface of the packaging unit is bonded to the substrate.

2. An electronic paper display device including an electronic paper panel and various components, comprising:
   a substrate made of an insulating material and being provided with wirings on a surface thereof and therein; and
   a driving IC bonded to the substrate and controlling the electronic paper panel to display an image,
   wherein the substrate is provided with an inserting hole corresponding to the driving IC, the inserting hole penetrating through a top portion and a bottom portion of the substrate, and includes:
   a first driving IC unit formed by bonding the driving IC to a bottom surface of a packaging unit whose bottom surface is provided with wirings, and
   a second driving IC unit formed by bonding the driving IC to a top surface of the packaging unit whose top surface is provided with wirings,
   the driving IC of the first driving IC unit being inserted into the inserting hole of a top surface of the substrate and the substrate being bonded to the bottom surface of the packaging unit, and
   the driving IC of the second driving IC unit being inserted into the inserting hole of a bottom surface of the substrate and the substrate being bonded to the top surface of the packaging unit.

3. The electronic paper display device according to claim 1 or 2, wherein the packaging unit has a triangular shape.

4. The electronic paper display device according to claim 1 or 2, wherein the packaging unit has a semicircular shape.

5. A method for manufacturing an electronic paper display device, comprising:
   manufacturing a substrate; and
   bonding an electronic paper panel, components, and a driving IC to the substrate,
   wherein the bonding the electronic paper panel, the components, and the driving IC to the substrate includes:
   bonding the driving IC to a bottom surface of a packaging unit whose bottom surface is provided with wirings; and
   inserting the driving IC into an inserting hole of the substrate and bonding the bottom surface of the packaging unit to the substrate so that the wirings of the bottom surface of the packaging unit are connected to wirings of the substrate,
   wherein the inserting hole penetrates through a top portion and a bottom portion of the substrate.

6. A method for manufacturing an electronic paper display device, comprising:
   manufacturing a substrate;
   bonding an electronic paper panel, components, and a driving IC attached to a packaging unit to the substrate,
   wherein the bonding the electronic paper panel, the components, and the driving IC attached to the packaging unit to the substrate includes inserting the driving IC into an inserting hole of the substrate and bonding a bottom surface of the packaging unit to the substrate so that wirings of the bottom surface of the packaging unit are connected to wirings of the substrate,
   wherein the inserting hole penetrates through a top portion and a bottom portion of the substrate.

* * * * *